US012249965B2

(12) United States Patent
Cassia et al.

(10) Patent No.: US 12,249,965 B2
(45) Date of Patent: Mar. 11, 2025

(54) FRONT-END CIRCUITRY WITH AMPLIFIER PROTECTION

(71) Applicant: QUALCOMM Incorporated, San Diego, CA (US)

(72) Inventors: Marco Cassia, San Diego, CA (US); Jose Cabanillas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 332 days.

(21) Appl. No.: 17/808,040

(22) Filed: Jun. 21, 2022

(65) Prior Publication Data
US 2023/0412130 A1 Dec. 21, 2023

(51) Int. Cl.
| | |
|---|---|
| H03F 1/52 | (2006.01) |
| H03F 1/56 | (2006.01) |
| H03F 3/195 | (2006.01) |
| H03F 3/24 | (2006.01) |
| H04B 1/04 | (2006.01) |

(52) U.S. Cl.
CPC ............ *H03F 3/245* (2013.01); *H03F 1/52* (2013.01); *H03F 1/56* (2013.01); *H03F 3/195* (2013.01); *H04B 1/0458* (2013.01); *H03F 2200/451* (2013.01); *H03F 2200/471* (2013.01); *H04B 2001/0408* (2013.01)

(58) Field of Classification Search
CPC . H03F 3/245; H03F 3/195; H03F 1/56; H03F 1/52; H03F 2200/451; H03F 2200/471; H04B 1/0458; H04B 2001/0408
See application file for complete search history.

(56) References Cited

U.S. PATENT DOCUMENTS

| | | | | | |
|---|---|---|---|---|---|
| 5,977,831 | A | * | 11/1999 | Davis ................... | H03G 3/3042 330/129 |
| 5,994,965 | A | * | 11/1999 | Davis ................... | H03G 3/3036 330/279 |
| 6,804,502 | B2 | * | 10/2004 | Burgener ........... | H03K 17/6871 257/341 |
| 7,342,445 | B2 | * | 3/2008 | Aridas ................. | H03G 3/004 330/133 |

(Continued)

OTHER PUBLICATIONS

International Search Report and Written Opinion—PCT/US2023/067295—ISA/EPO—Sep. 13, 2023.

*Primary Examiner* — Hai V Nguyen
(74) *Attorney, Agent, or Firm* — Patterson & Sheridan LLP

(57) ABSTRACT

Methods and apparatus for providing amplifier protection for a radio frequency (RF) front-end circuit. An example RF front-end circuit generally includes an amplifier with a gain, a first sensor configured to sense a first power (or voltage) of a first node coupled to an input of the amplifier, a second sensor configured to sense a second power (or voltage) of a second node coupled to an output of the amplifier, and logic coupled to the first and second sensors. The logic is generally configured to determine that the second power (or voltage) is outside a range based on the gain and the first power (or voltage) and to take an action to protect the amplifier based on the determination. By utilizing the techniques and apparatus described herein, protection can be provided to the amplifier(s) in an RF front-end circuit without significantly impacting the performance of the RF front-end circuit.

20 Claims, 6 Drawing Sheets

(56) References Cited

U.S. PATENT DOCUMENTS

| | | | | |
|---|---|---|---|---|
| 7,910,993 B2* | 3/2011 | Brindle | H03K 17/162 | 257/347 |
| 8,099,199 B2* | 1/2012 | Takegami | H02M 3/157 | 700/298 |
| 8,131,251 B2* | 3/2012 | Burgener | H03F 3/68 | 455/341 |
| 8,213,882 B2* | 7/2012 | Ueno | H04L 25/0272 | 455/114.2 |
| 8,497,737 B2* | 7/2013 | Langer | H03F 3/189 | 330/296 |
| 8,829,997 B1* | 9/2014 | Morkner | H03G 3/3042 | 330/285 |
| 8,947,164 B2* | 2/2015 | Eplett | H03F 1/56 | 330/278 |
| 9,020,451 B2* | 4/2015 | Khlat | H03F 1/0227 | 455/127.1 |
| 9,024,700 B2* | 5/2015 | Ranta | H01F 21/12 | 327/554 |
| 9,209,771 B1* | 12/2015 | Kavousian | H01Q 7/00 | |
| 9,602,060 B2* | 3/2017 | Gorbachov | H03F 1/0266 | |
| 10,715,200 B2* | 7/2020 | Burgener | H03F 3/21 | |
| 10,938,348 B1* | 3/2021 | Noori | H03F 1/223 | |
| 10,979,002 B2* | 4/2021 | Chen | H03F 1/0266 | |
| 11,043,928 B2* | 6/2021 | Valk | H03G 3/3042 | |
| 11,239,803 B2* | 2/2022 | Daruwalla | H03F 1/0222 | |
| 11,576,248 B2* | 2/2023 | Wallis | H03F 1/32 | |
| 11,588,513 B2* | 2/2023 | Burgener | H03F 3/19 | |
| 2001/0003433 A1* | 6/2001 | Hu | H03F 3/604 | 330/132 |
| 2006/0270367 A1* | 11/2006 | Burgener | H03G 11/00 | 455/333 |
| 2007/0026812 A1* | 2/2007 | Hu | H03G 3/3042 | 455/69 |
| 2010/0296600 A1* | 11/2010 | Ueno | H03F 3/245 | 375/295 |
| 2014/0028368 A1* | 1/2014 | Khlat | H03H 7/0107 | 327/311 |
| 2014/0103996 A1* | 4/2014 | Horiguchi | H03F 1/56 | 330/127 |
| 2015/0015339 A1* | 1/2015 | Gorbachov | H03G 3/3042 | 330/291 |
| 2015/0365062 A1* | 12/2015 | Kavousian | H03H 7/0153 | 333/213 |
| 2016/0294327 A1* | 10/2016 | Asuri | H03F 1/3205 | |
| 2019/0020317 A1* | 1/2019 | Chen | G05F 3/225 | |
| 2019/0117083 A1* | 4/2019 | Wang | A61B 5/6833 | |
| 2020/0014417 A1* | 1/2020 | Burgener | H03F 3/2171 | |
| 2020/0169235 A1* | 5/2020 | Valk | H03F 3/24 | |
| 2020/0373962 A1* | 11/2020 | Burgener | H03F 3/189 | |
| 2021/0083630 A1* | 3/2021 | Daruwalla | H03F 3/72 | |
| 2021/0083631 A1* | 3/2021 | Daruwalla | H04B 1/006 | |
| 2022/0006484 A1* | 1/2022 | Burgener | H03G 11/00 | |
| 2022/0385328 A1* | 12/2022 | Lehtola | H03F 1/52 | |
| 2023/0096011 A1* | 3/2023 | Scott | H03F 3/245 | 330/127 |
| 2023/0361110 A1* | 11/2023 | Abessolo Bidzo | H03F 3/195 | |
| 2024/0142362 A1* | 5/2024 | Lee | G01N 15/0637 | |

* cited by examiner

FRONT-END CIRCUITRY WITH AMPLIFIER PROTECTION

TECHNICAL FIELD

Certain aspects of the present disclosure generally relate to electronic circuits and, more particularly, to techniques and apparatus for providing amplifier protection for a radio frequency front-end circuit.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a power amplifier (PA), which may be used to amplify a radio frequency (RF) signal before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include providing protection to amplifiers in a radio frequency (RF) front-end circuit without significantly impacting the performance of the RF front-end circuit.

Certain aspects of the present disclosure provide a radio frequency front-end circuit. The radio frequency front-end circuit generally includes a power amplifier configured to amplify an input signal with a gain, a first sensor coupled to a first node coupled to an input of the power amplifier and configured to sense at least one of a first power or a first voltage of the first node, a second sensor coupled to a second node coupled to an output of the power amplifier and configured to sense at least one of a second power or a second voltage of the second node, and logic coupled to the first sensor and the second sensor. The logic is generally configured to determine that the at least one of the second power or the second voltage is outside a range based on the gain and the at least one of the first power or the first voltage and to take an action to protect the power amplifier based on the determination.

Certain aspects of the present disclosure provide a method of wireless communications. The method generally includes operating a power amplifier with a gain, sensing at least one of a first power or a first voltage of a first node coupled to an input of the power amplifier, and sensing at least one of a second power or a second voltage of a second node coupled to an output of the power amplifier. The method also generally includes determining that the at least one of the second power or the second voltage is outside a range based on the gain and the at least one of the first power or the first voltage, and taking an action to protect the power amplifier based on the determination.

Certain aspects of the present disclosure provide an apparatus for wireless communications. The apparatus generally includes means for amplifying a signal with a gain, first means for sensing at least one of a first power or a first voltage of a first node coupled to an input of the means for amplifying, and second means for sensing at least one of a second power or a second voltage of a second node coupled to an output of the means for amplifying. The apparatus also generally includes means for determining that the at least one of the second power or the second voltage is outside a range based on the gain and the at least one of the first power or the first voltage, and means for taking an action to protect the means for amplifying based on the determination.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for providing amplifier protection for a radio frequency (RF) front-end circuit. Such techniques and apparatus involve protection circuitry used to detect input and output conditions and to implement protective measures to amplifiers for certain conditions.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
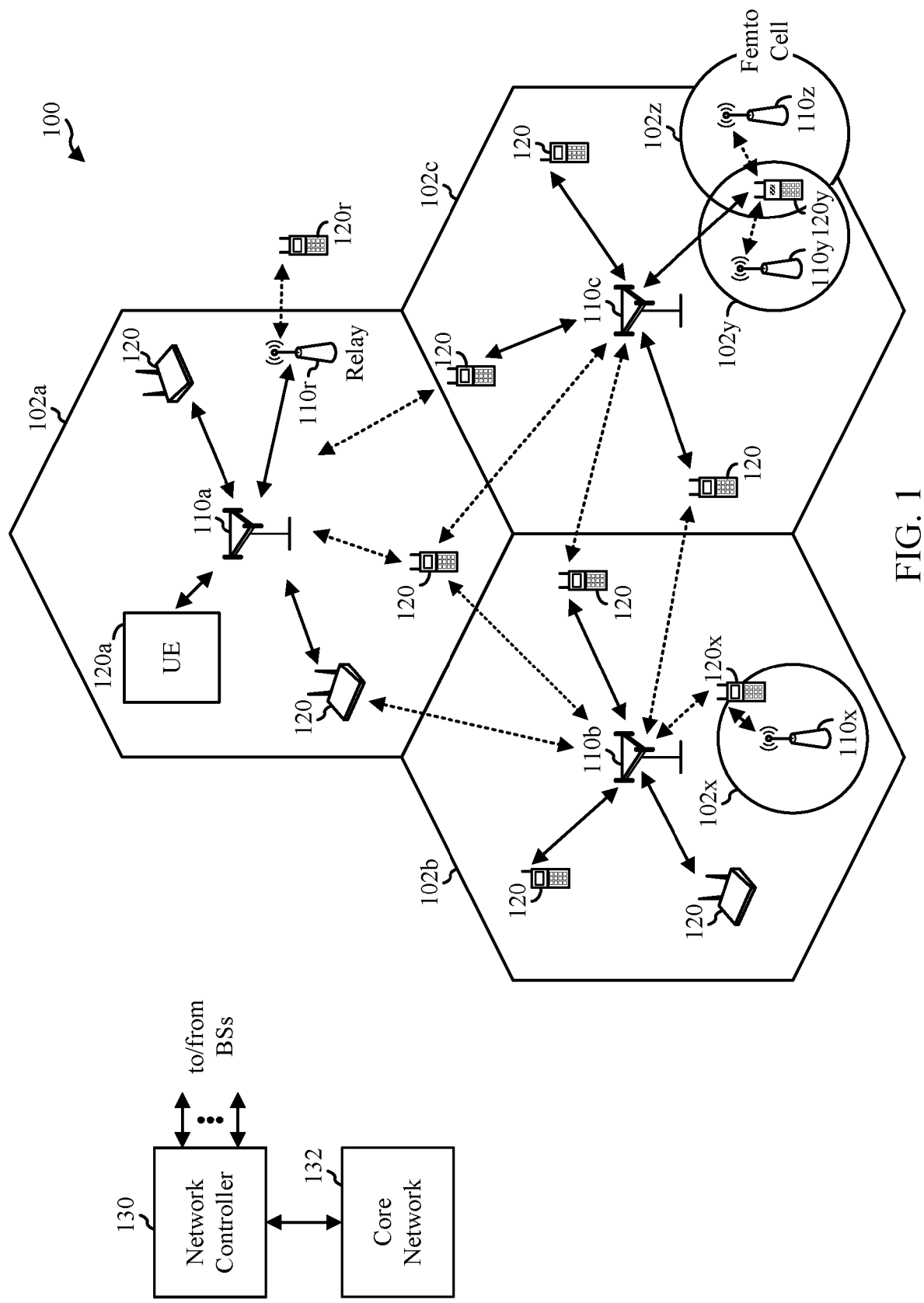
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. ABS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$, and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include RF front-end circuitry with amplifier protection, as described in more detail herein.

Figure 2:
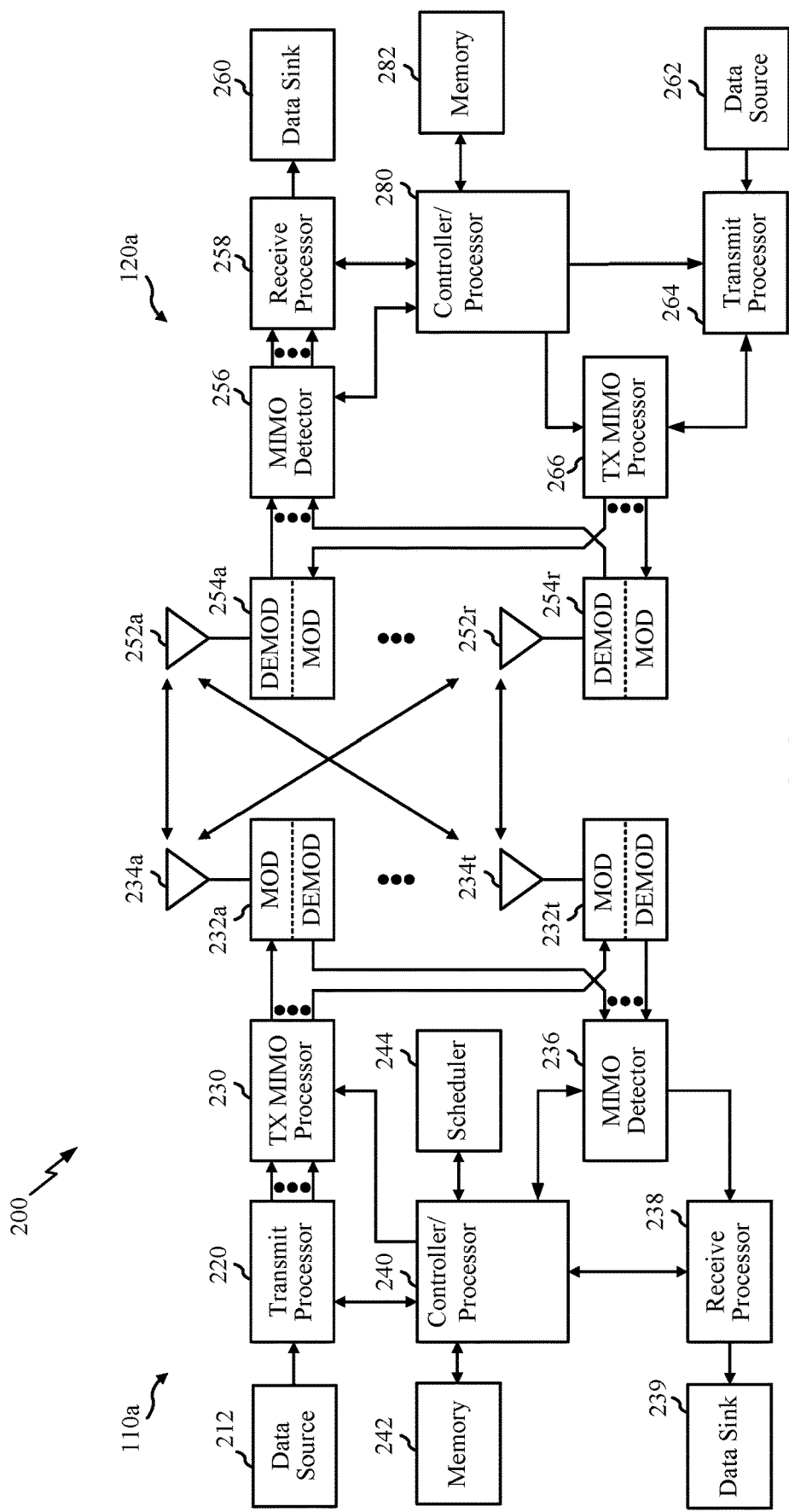
FIG. 2 is a block diagram conceptually illustrating a design of an example a base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARD) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include RF front-end circuitry with amplifier protection, as described in more detail herein.

Example Radio Frequency Transceiver

Figure 3:
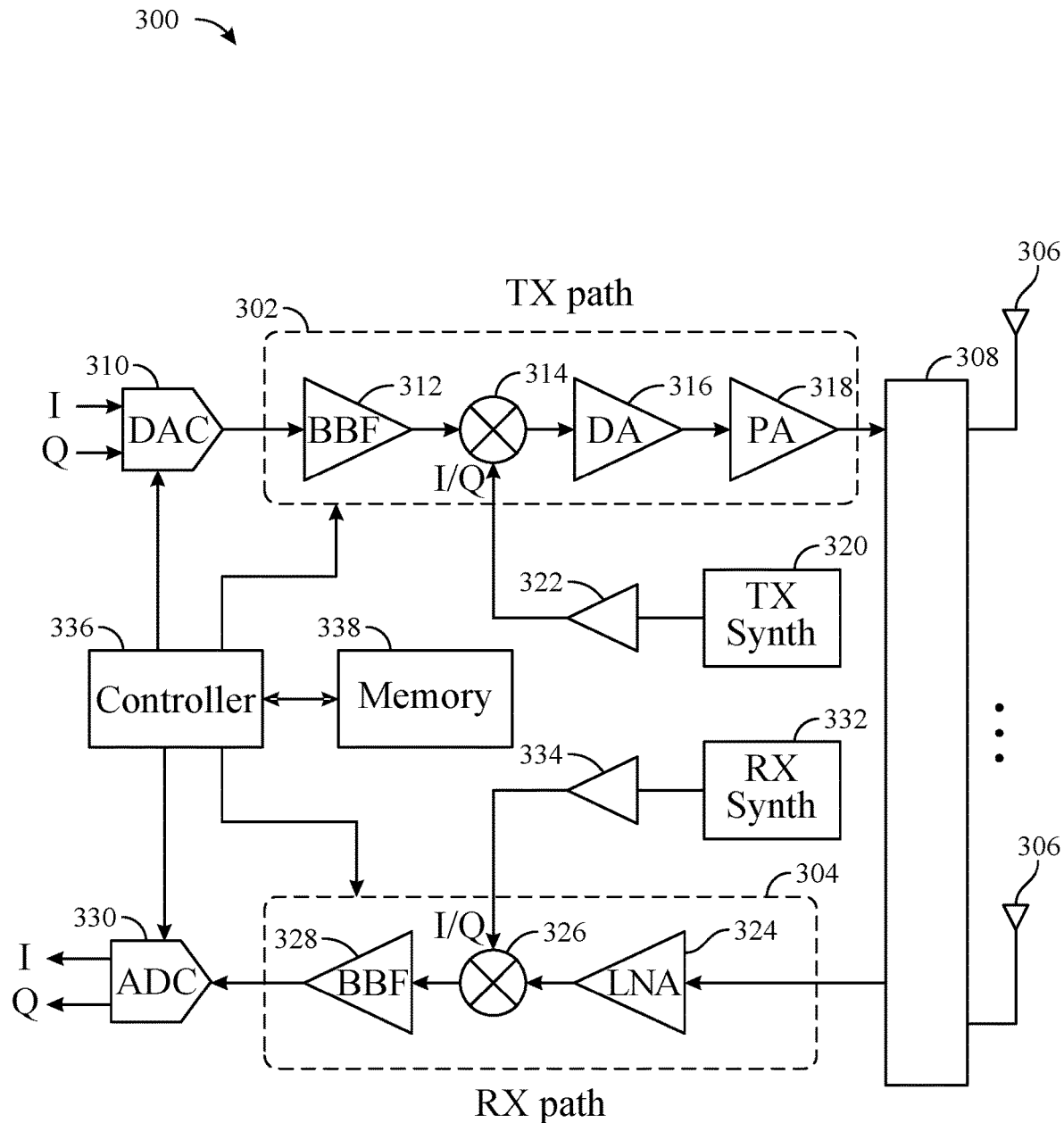
FIG. 3 is a block diagram of an example radio frequency (RF) transceiver, in which aspects of the present disclosure may be practiced.

FIG. 3 is a block diagram of an example RF transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the one or more antennas 306. When the TX path 302 and the RX path 304 share an antenna 306, the paths may be connected with the antenna via an interface 308, which may include any of various suitable RF devices, such as a switch, a duplexer, a diplexer, a multiplexer, a switchplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the TX path 302 may be implemented with amplifier protection circuitry for protecting at least one amplifier (e.g., PA 318, DA 316) in the TX path 302, as described in more detail below.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 240 or 280 in FIG. 2) may direct the operation of the RF transceiver circuit 300, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 242 or 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for providing amplifier protection in any of various other suitable systems (e.g., an audio system or other electronic systems which utilize amplifiers).

Example Radio Frequency Front-End Circuit with Amplifier Protection Circuitry

Power amplifiers (PAs, such as PA 318) are designed to transmit power in certain bands (e.g., inside a specified frequency band) of operation where impedances (as well as voltages and currents) have been designed to ensure the reliability and ruggedness of the PAs. The design of a PA ensures that even a large voltage standing wave ratio (VSWR) at the output of the PA can be sustained in the PA's bands of operation. Outside a PA's bands of operation, PAs are commonly used in conjunction with filters or duplexers that present very extreme and fast-changing impedances (e.g., very high or very low impedances) in order to fulfill PA isolation and rejection specifications or targets.

Generally, when signals are transmitted inside the expected band of operation (e.g., inside a specified frequency band), these out-of-band impedances may not pose a challenge to the PA. However, in some situations, a strong input signal that is outside the expected band of operation (e.g., outside a specified frequency band) can be present in a PA for a number of reasons. For example, the presence of a strong input signal that is outside the expected band of operation may be a result of the oscillation of the stage driving the PA. Such out-of-band signals present at a PA combined with the out-of-band impedances can create large voltages and currents that can severely damage or even destroy the PA.

To improve the ruggedness of and protect the amplifiers in an RF front-end circuit, certain aspects of the present disclosure provide techniques and apparatus for providing amplifier protection. Such protection may include amplifier protection circuitry configured to detect input and output conditions, and to implement protective measures for amplifiers when certain risk conditions are detected. Risk conditions may include out-of-band high power input signals in the presence of extreme impedances at the PA output due to filter or duplexer impedance characteristics. For example, if a high input signal is detected at the input of a PA, but the output of the PA does not reach an expected level related to the known gain of the PA, the amplifier may be exposed to a risk condition that could cause damage. Another risk condition may be that a post-PA component (e.g., switch, such as a band select switch, antenna switch module, etc.) is not turned on properly, is broken, or is malfunctioning, and, as a result, the output of the PA is followed by an open switch. A turned off, broken, or malfunctioning post-PA component may be caused during assembly and/or programming of the RF front-end circuit.

Certain aspects of the present disclosure provide techniques and apparatus for providing protection to the amplifier(s) in an RF front-end circuit, without significantly impacting the performance of the RF front-end circuit. For example, the techniques and apparatus described herein may provide amplifier protection without introducing a high amount of loss, limiting the magnitude of some of the parameters of the RF front-end circuit, or introducing undesirable complexity.

Figure 4A:
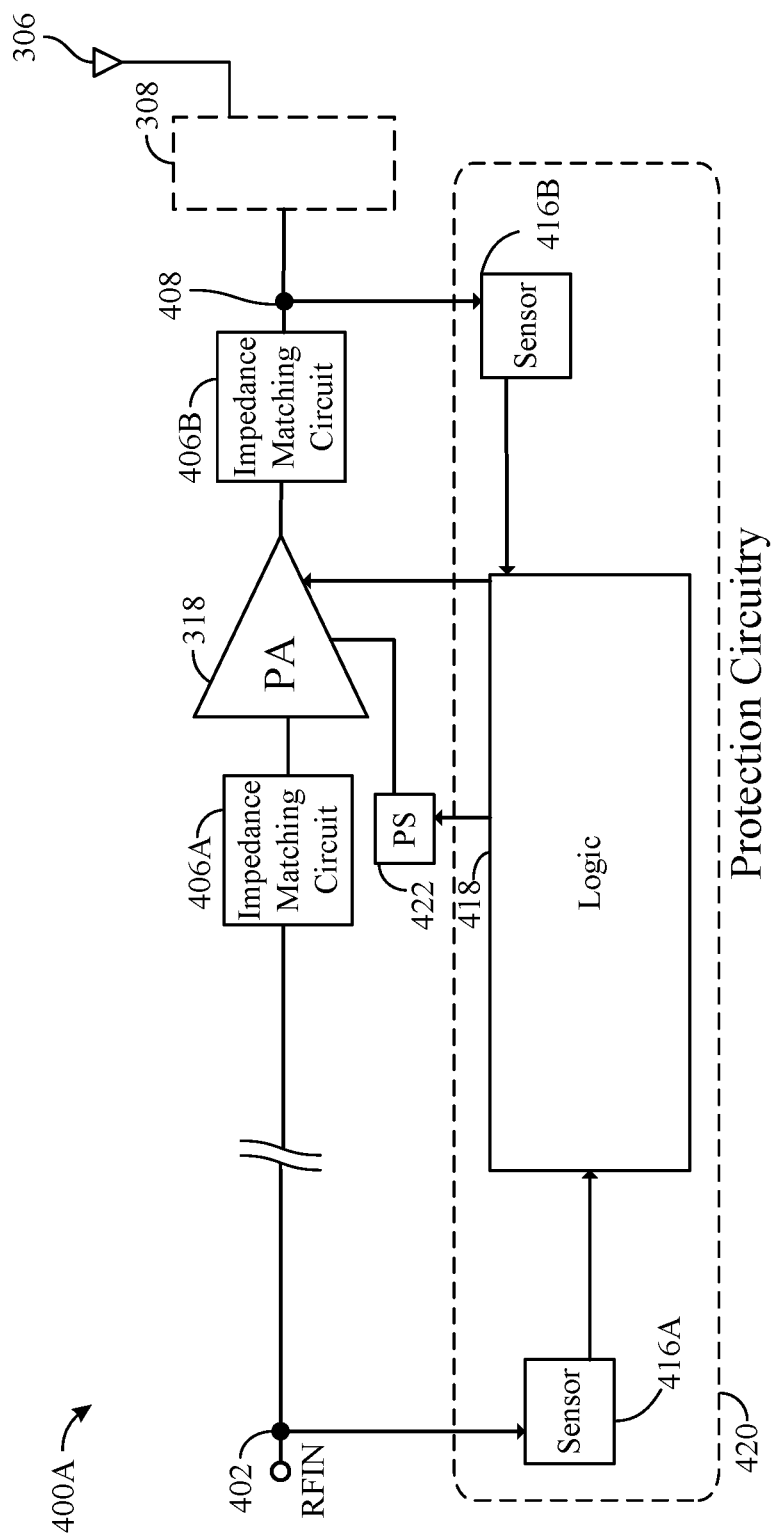
FIG. 4A illustrates an example RF front-end circuit with amplifier protection circuitry, in accordance with certain aspects of the present disclosure.

FIG. 4A illustrates an example RF front-end circuit 400A with amplifier protection circuitry (e.g., protection circuitry 420), in accordance with certain aspects of the present disclosure. According to certain aspects, the RF front-end circuit 400A may be included in a TX path (e.g., TX path 302) of an RF transceiver circuit (e.g., RF transceiver circuit 300).

For certain aspects, the RF front-end circuit 400A may include a node 402, an impedance matching circuit 406A, a PA 318, an impedance matching circuit 406B, a node 408, an antenna 306, and an interface 308. Although not shown in FIG. 4A, the PA 318 in FIG. 4A may be replaced by a driver amplifier (e.g., the DA 316) in series with the PA 318. For ease of description, only the PA 318 will be described henceforth with respect to FIG. 4A. The PA 318 may be coupled to a power supply (PS) 422 via a power supply rail, and may have a specified gain parameter. In some aspects, the RF front-end circuit 400A may also include protection circuitry 420. The protection circuitry 420 may include one or more sensors 416A, 416B, and logic 418.

For certain aspects, the node 402 may be coupled to the input of the impedance matching circuit 406A, and the impedance matching circuit 406A may have an output coupled to the input of the PA 318. In some aspects, there may be additional circuitry between the node 402 and the impedance matching circuit 406A. The output of the PA 318 may be coupled to the input of the impedance matching circuit 406B, and the output of the impedance matching circuit 406B may be coupled to the node 408. Either or both of the impedance matching circuits 406A, 406B may be tunable. In such cases, the impedance of the tunable impedance matching circuits may be adjusted by a controller (e.g., the controller 336).

The node 408 may be coupled to the antenna 306 via an interface 308. The interface 308 may include any of various suitable RF devices, such as a switch, a duplexer, a diplexer, a multiplexer, a switchplexer, and the like. In certain aspects, there may be additional circuitry between the impedance matching circuit 406B and the node 408. For example, the RF front-end circuit 400A may include a band select switch coupled to the output of the impedance matching circuit 406B, and the band select switch may be used to couple to one or more banks of filters or duplexers.

For certain aspects, the sensor 416A of the protection circuitry 420 may be coupled to the node 402, and the sensor 416B of the protection circuitry 420 may be coupled to the node 408. The logic 418 may be coupled to (and in some cases, configured to control at least one of) the sensors 416A, 416B and the PS 422 of the PA 318. The logic 418 may also be coupled to and configured to control the PA 318. In such cases, the logic 418 of the protection circuitry 420 may be part of a controller (e.g., controller 336) for the RF front-end circuit 400A.

For certain aspects, the PA 318 may be configured to amplify an RF input signal (labeled "RFIN") to the RF front-end circuit 400A with a gain. The gain may be the specified gain parameter associated with the PA 318. The sensors 416A, 416B may be configured so as to allow for the detection of the presence of strong out-of-band signals in the PA 318. For example, the sensor 416A may be configured to sense at least one of a first power or a first voltage at the node 402, and the sensor 416B may be configured to sense at least one of a second power or a second voltage at the node 408. In some scenarios, the input and output powers and/or voltages detected by the sensors 416A, 416B may be related by the gain parameter of the PA 318. In other scenarios, the input and output powers and/or voltages detected by the sensors 416A, 416B may not be related by the gain parameter of the PA 318.

For certain aspects, the logic 418 may determine if a risk condition is detected by using at least one sensor 416A, 416B. Determining if a risk condition is detected may include comparing the voltages or powers at two nodes in the RF front-end circuit 400A to determine if the output signal is in an expected range. The logic 418 may determine if the output signal is in an expected range by determining if the second power and/or the second voltage is outside an expected range based on (i) the known gain parameter of the PA 318 and (ii) the first power and/or the first voltage.

For example, when (i) a high input signal of the PA 318 is detected by the sensor 416A and (ii) the output signal of the PA 318 detected by the sensor 416B does not attain an expected level based on the known gain of the PA 318, the PA 318 may be exposed to a risk condition that could damage the PA 318. In another example, when (i) a high input signal of the PA 318 is detected by the sensor 416A and (ii) the output signal of the PA 318 detected by the sensor 416B reaches an expected level based on the known gain of the PA 318, the PA 318 may be considered as not being exposed to a risk condition that could damage the PA 318. In certain aspects, the logic 418 may be programmed with the known gain of the PA 318, and may calculate an expected range at the output of the PA 318 based on the known gain and the location of the sensor 416B in the RF front-end circuit 400A. The expected range may also be determined using other known parameters of the RF front-end circuit 400A.

For certain aspects, when the logic 418 has detected the presence of a risk condition, the logic 418 may be configured to output an indication based on the determination. In some aspects, the logic 418 may take at least one action to protect the PA 318 based on the detection. The at least one action may include lowering the PA 318 bias, lowering the voltage of a power supply rail for the PA 318 (e.g., a voltage common collector (VCC) rail), engaging an attenuator (not shown in FIG. 4A, but see FIG. 4B), or lowering the magnitude of the RFIN signal. In certain aspects, the at least one action may include powering off the PA 318.

Figure 4B:
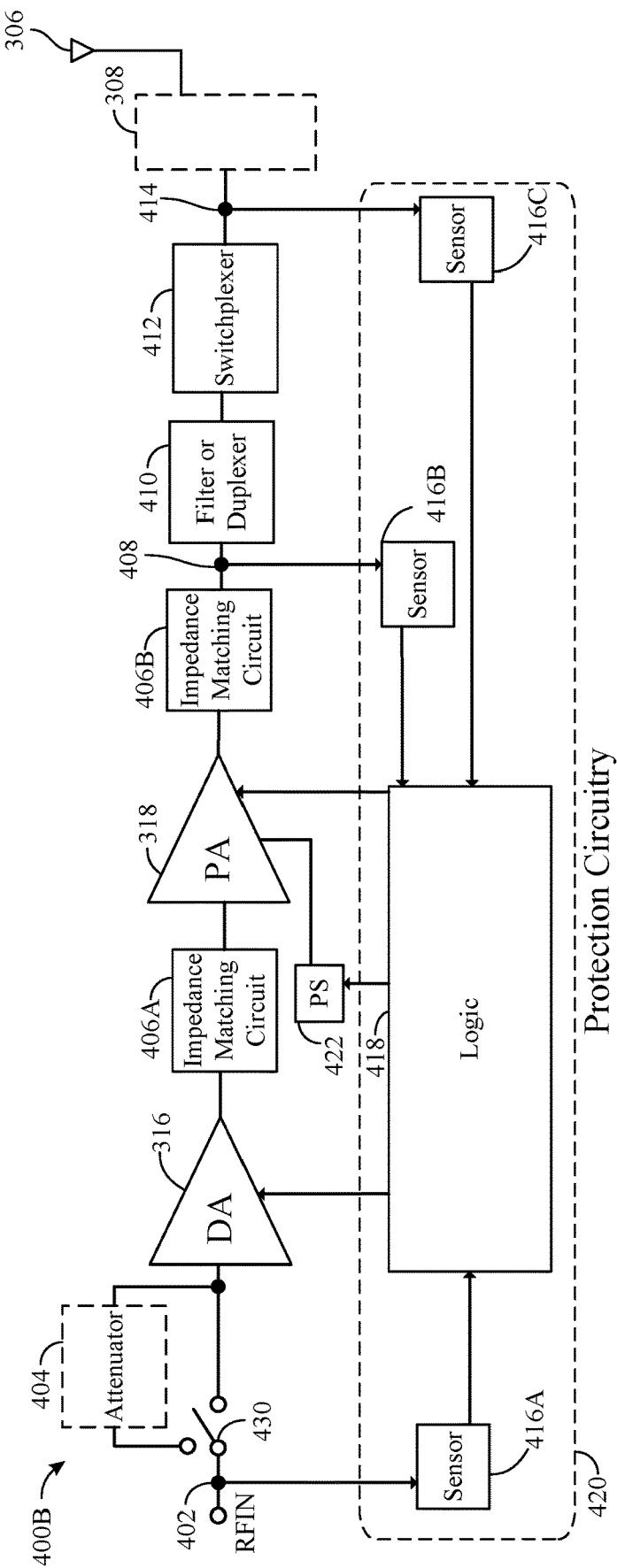
FIG. 4B illustrates another example RF front-end circuit with amplifier protection circuitry, in accordance with certain aspects of the present disclosure.

FIG. 4B illustrates an example RF front-end circuit 400B with amplifier protection circuitry (e.g., protection circuitry 420), in accordance with certain aspects of the present disclosure. According to certain aspects, the RF front-end circuit 400B may be included in a TX path (e.g., TX path 302) of an RF transceiver circuit (e.g., RF transceiver circuit 300).

For certain aspects, the RF front-end circuit 400B may include a node 402, an attenuator 404, a DA 316, an impedance matching circuit 406A, a PA 318, an impedance matching circuit 406B, a node 408, a filter or duplexer 410, a switchplexer 412, a node 414, an antenna 306, and an interface 308. In some aspects, the DA 316 may be removed and replaced with a short or another component. In some aspects, the attenuator 404 may be included in the DA 316. The RF front-end circuit 400B may also include protection circuitry 420. The protection circuitry 420 may include one or more sensors 416A, 416B, 416C and logic 418. Note that the RF front-end circuit 400B is a reference example of a RF front-end circuit that may include amplifier protection circuitry, and that the RF front-end circuit 400 may include different components. For example, in some aspects, the RF front-end circuit 400B may not include an attenuator 404. Hence, the optional attenuator 404 is illustrated with a dashed box.

For certain aspects, the node 402 may be selectively coupled to the input of the attenuator 404 or the input of the DA 316 via a switch 430. The output of the attenuator 404 may be coupled to the input of the DA 316. For other aspects, the switch 430 and/or the attenuator 404 may be eliminated, and in these aspects, the node 402 may be connected to the input of the DA 316 or coupled to the input of the DA 316 via one or more other components. The output of the DA 316 may be coupled to the input of the impedance matching circuit 406A, and the impedance matching circuit 406A may have an output coupled to the input of the PA 318. The output of the PA 318 may be coupled to the input of the impedance matching circuit 406B, and the output of the impedance matching circuit 406B may be coupled to the node 408. The node 408 may be coupled to the input of a filter or duplexer 410, and the output of the filter or duplexer 410 may be coupled to the input of a switchplexer 412. The output of the switchplexer 412 may be coupled to the node 414. The node 414 may be coupled to the antenna 306 via an interface 308, as described above. In certain aspects, the RF front-end circuit 400B may also include a band select switch coupled to the output of the impedance matching circuit 406B and to the input of the filter or duplexer 410, and additional banks of filters or duplexers may also be included. For certain aspects, the switchplexer 412 and/or the filter or duplexer 410 may be eliminated, and in some such cases, may be replaced by one or more other components.

For certain aspects, the sensor 416A of the protection circuitry 420 may be coupled to the node 402, the sensor 416B of the protection circuitry 420 may be coupled to the node 408, and the sensor 416C of the protection circuitry 420 may be coupled to the node 414. For other aspects, the sensor 416C may be coupled to another node in the circuit path between the output of the impedance matching circuit 406B and the antenna 306 (e.g., a node between the filter or duplexer 410 and the switchplexer). The logic 418 may be coupled to (and in some cases, configured to control one or more of) the sensors 416A, 416B, 416C and the PS 422. In some aspects, the logic 418 may also be coupled to and configured to control at least one of the PA 318, the DA 316, the attenuator 404, or the switch 430. For certain aspects, one or more of the sensors 416A, 416B, 416C may include one or more rectifiers to generate a direct current (DC) voltage or power that is proportional to the alternating current (AC) voltage or power measured at a node (e.g., node 402, node 408, node 414) for use by the logic 418 (e.g., in determining if the output signal of the PA 318 is in an expected range).

For certain aspects, the PA 318 may be configured to amplify an RFIN signal to the RF front-end circuit 400B with a gain. The gain may be the specified gain parameter associated with the PA 318. The sensors 416A, 416B, 416C may allow for the detection of the presence of strong out-of-band signals in at least one of the DA 316 or PA 318. For example, the sensor 416A may be configured to sense at least one of a first power or a first voltage at the node 402, the sensor 416B may be configured to sense at least one of a second power or a second voltage at the node 408, and the sensor 416C may be configured to sense at least one of a third power or a third voltage at the node 414. In some scenarios, the input and output powers and/or voltages detected by the sensors 416A, 416B, 416C may be related by the gain parameter of the PA 318. In other scenarios, the input and output power and/or voltage detected by the sensors 416A, 416B, 416C may not be related by the gain parameter of the PA 318.

For certain aspects, the logic 418 may determine if a risk condition is detected by using at least one of the sensors 416A, 416B, 416C. Determining if a risk condition is detected may include comparing the voltages or powers at the node 402 and the node 408 (and/or node 414) in the RF front-end circuit 400B to determine if the output signal is in an expected range. The logic 418 may determine if the output signal is in an expected range by determining if the at least one of the second (or third) power or the second (or third) voltage is outside the range based on (i) the known gain of the DA 316 plus the PA 318 and (ii) the at least one of the first power or the first voltage.

For example, when (i) a high input signal for the DA 316 (or for the PA 318) is detected by the sensor 416A and (ii) the output signal of the PA 318 detected by the sensor 416B does not attain an expected level based on the known gain of the DA 316 plus the PA 318, the DA 316 and/or the PA 318 may be exposed to a risk condition that could damage at least one of the PA 318 or the DA 316. Such an example may be the result of a post-PA component (e.g., switch, such as a band select switch, antenna switch module, etc.) having not been turned on properly, being broken, or malfunctioning. As a result of such a defective post-PA component, the output of the PA 318 may be followed by an open switch, causing the output of the PA 318 to be lower than the expected output based on the known combined gain of the DA and PA.

In another example, when (i) a high input signal for the DA 316 (or the PA 318) is detected by the sensor 416A and (ii) the output signal of the PA 318 detected by the sensor 416B reaches an expected level based on the known combined gain of the DA and PA, the DA 316 and PA 318 may be considered as not being exposed to a risk condition that could damage at least one of the DA 316 or PA 318. In certain aspects, the logic 418 may be programmed with the known gains of the DA 316 and the PA 318 (or with the combined gain of the DA and PA), and may calculate an expected range at the output of the PA 318 based on the known gain(s) and the received information from the sensor 416B (and/or sensor 416C) in the RF front-end circuit 400B. The expected range may also be determined using other known parameters of the RF front-end circuit 400B.

For certain aspects, determining if a risk condition is detected may include comparing the voltage or power at the node 402 and the node 414 in the RF front-end circuit 400B by using sensors 416A, 416C to determine if the output signal is in an expected range. The logic 418 may determine if the at least one of the third power or the third voltage is outside the range based on (i) the known gain of the PA 318 and (ii) the at least one of the first power or the first voltage.

For example, when (i) a high input signal for the DA 316 (or the PA 318) is detected by the sensor 416A and (ii) the output signal of the PA 318 detected by the sensor 416C does not attain an expected level based on the known combined gain of the DA 316 and the PA 318, the DA and/or PA may be exposed to a risk condition that could damage at least one of the DA 316 or PA 318. Such an example may be the result of an out-of-band high power RFIN signal in the presence of extreme impedances at the PA 318 output (e.g., due to impedance characteristics of the filter or duplexer 410), causing the output of the PA 318 to be lower than the expected output based on the known combined gain of the DA 316 and PA 318. In addition, such an example may be the result of a post-PA component having not been turned on properly, being broken, or malfunctioning. As noted, as a result of such a defective post-PA component, the output of the PA may be followed by an open switch, causing the output of the PA 318 to be lower than the expected output based on the known combined gain of the DA and PA. In another example, when (i) a high input signal for the DA 316 (or the PA 318) is detected by the sensor 416A and (ii) the output signal of the PA 318 detected by the sensor 416C reaches an expected level based on the known gain of the PA 318, the PA 318 may be considered as not being exposed to a risk condition that could damage at least one of the PA 318 or the DA 316.

For certain aspects, when the logic 418 has detected the presence of a risk condition, the logic 418 may be configured to output an indication based on the determination. In some aspects, the logic 418 may take at least one action to protect the PA 318 and/or DA 316 based on the detection. The at least one action may include lowering the PA 318 bias, lowering the voltage of the power supply rail (e.g., VCC) for the PA 318, engaging an attenuator (e.g., attenuator 404, by controlling the associated switch 430 to route the RFIN signal through the attenuator), or lowering the amplitude of the RFIN signal. In certain aspects, the at least one action may include at least one of powering off the PA 318 or powering off the DA 316.

Example Protection Operations

Figure 5:
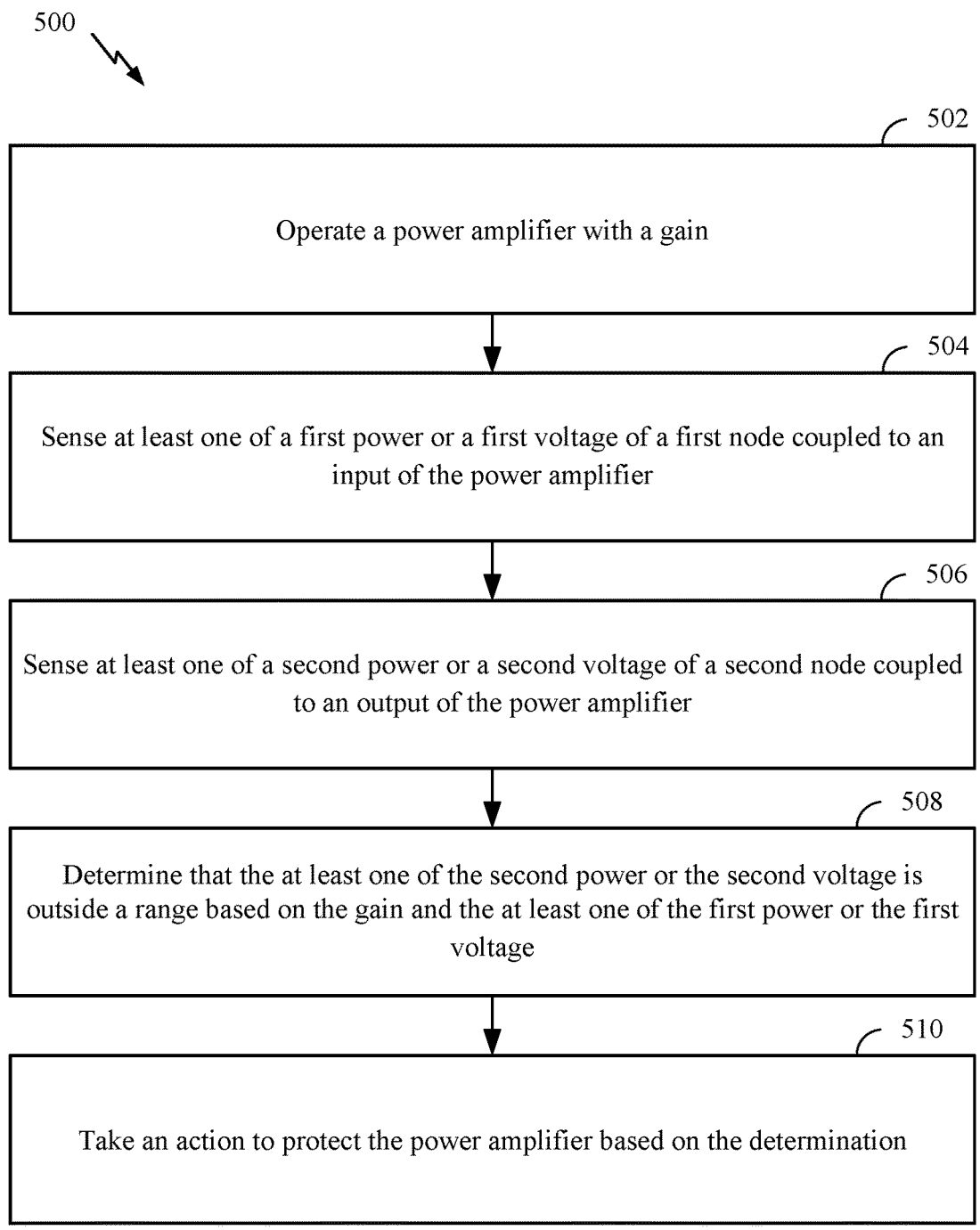
FIG. 5 is a flow diagram of example operations for providing amplifier protection, in accordance with certain aspects of the present disclosure.

FIG. 5 is a flow diagram of example operations 500 for providing amplifier (e.g., driver amplifier (DA) 316 and/or power amplifier (PA) 318) protection, in accordance with certain aspects of the present disclosure. The operations 500 may be performed by an RF front-end circuit, such as the RF front-end circuit 400A, 400B of FIG. 4A or 4B, respectively. In certain aspects, the RF front-end circuit 400A, 400B may include protection circuitry 420.

The operations 500 may generally include, at block 502, operating a power amplifier (PA, such as PA 318, alone or in conjunction with DA 316) with a gain. The gain may be a specified gain parameter associated with the PA, which may be stored in memory (e.g., memory 338) and/or set by a controller (e.g., controller 336).

According to certain aspects, the operations 500 may further include, at block 504, sensing at least one of a first power or a first voltage of a first node (e.g., node 402) coupled to an input of the power amplifier. In some aspects, the sensing may be performed by a first sensor (e.g., sensor 416A).

According to certain aspects, the operations 500 may further include, at block 506, sensing at least one of a second power or a second voltage of a second node (e.g., node 408 or node 414) coupled to an output of the power amplifier. In some aspects, the sensing may be performed by a second sensor (e.g., sensor 416B or sensor 416C).

According to certain aspects, the operations 500 may further include, at block 508, determining that the at least one of the second power or the second voltage is outside a range (e.g., an expected range) based on (i) the gain and (ii) the at least one of the first power or the first voltage. In some aspects, the determining may be performed by logic (e.g., logic 418), which may be part of a controller (e.g., controller 336). In certain aspects, the logic may be programmed with the known gain of the PA, and may calculate the expected range at the output of the PA based on the known gain and the received sensor information, which depends on the location of the sensors.

According to certain aspects, the operations 500 may further include, at block 510, taking at least one action to protect the PA based on the determination. In some aspects, taking at least one action may include lowering a bias for the power amplifier, lowering a power supply voltage (e.g., voltage at PS 422) for the power amplifier, and/or engaging an attenuator (e.g., attenuator 404) having an output coupled to the input of the power amplifier. The attenuator may be engaged by the logic via operation of a switch (e.g., switch 430), as illustrated in FIG. 4B. Additionally or alternatively in some aspects, taking an action may include lowering a magnitude of an RF input signal (e.g., the RFIN signal) for the power amplifier. Additionally or alternatively in some aspects, taking an action may include powering off at least one of the power amplifier or a drive amplifier (e.g., DA 316). In some aspects, the at least one action may be performed by the logic.

According to certain aspects, the operations 500 may further include sensing (e.g., via the first sensor) at least one of a third power or a third voltage of the first node coupled to the input of the power amplifier. In this case, the operations 500 may further include sensing (e.g., via the second sensor) at least one of a fourth power or a fourth voltage of the second node (e.g., node 408 or node 414) coupled to the output of the power amplifier. In this case, the operations 500 may further include determining that the at least one of the fourth power or the fourth voltage is inside another range based on (i) the gain and (ii) the at least one of the third power or the third voltage. In some aspects, this determining may be performed by the logic. In this case, the operations 500 may further include reversing the action taken to protect the power amplifier (e.g., the action taken at block 510), based on the determination of being inside the other range. In some aspects, reversing the action may be performed by the logic.

Example Aspects

In addition to the various aspects described above, specific combinations of aspects are within the scope of the present disclosure, some of which are detailed below:

Aspect 1: A radio frequency front-end circuit comprising: a power amplifier configured to amplify an input signal with a gain; a first sensor coupled to a first node coupled to an input of the power amplifier and configured to sense at least one of a first power or a first voltage of the first node; a second sensor coupled to a second node coupled to an output of the power amplifier and configured to sense at least one of a second power or a second voltage of the second node; and logic coupled to the first sensor and the second sensor and configured to: determine that the at least one of the second power or the second voltage is outside a range based on the gain and the at least one of the first power or the first voltage; and take an action to protect the power amplifier based on the determination.

Aspect 2: The radio frequency front-end circuit of Aspect 1, wherein in taking the action, the logic is configured to control lowering of a bias for the power amplifier.

Aspect 3: The radio frequency front-end circuit of Aspect 1 or 2, wherein in taking the action, the logic is configured to control lowering a power supply voltage for the power amplifier.

Aspect 4: The radio frequency front-end circuit of any of Aspects 1-3, further comprising an attenuator having an output selectively coupled to the input of the power amplifier, wherein in taking the action, the logic is configured to control engagement of the attenuator.

Aspect 5: The radio frequency front-end circuit of any of Aspects 1-4, wherein in taking the action, the logic is configured to control lowering a magnitude of an input signal for the power amplifier.

Aspect 6: The radio frequency front-end circuit of Aspect 1, wherein in taking the action, the logic is configured to control powering off the power amplifier.

Aspect 7: The radio frequency front-end circuit of any of the preceding Aspects, wherein the logic is configured to output an indication based on the determination.

Aspect 8: The radio frequency front-end circuit of any of the preceding Aspects, further comprising a drive amplifier having an input coupled to the first node and to the first sensor and having an output coupled to the input of the power amplifier.

Aspect 9: The radio frequency front-end circuit of any of the preceding Aspects, further comprising an impedance matching circuit having an input coupled to the output of the power amplifier and having an output coupled to the second node and to the second sensor.

Aspect 10: The radio frequency front-end circuit of any of the preceding Aspects, further comprising a filter or a duplexer, the filter or the duplexer having an input coupled to the output of the power amplifier, to the second node, and to the second sensor.

Aspect 11: The radio frequency front-end circuit of Aspect 10, further comprising a third sensor coupled to a third node coupled to an output of the filter or the duplexer, the third sensor being configured to sense at least one of a third power or a third voltage of the third node, wherein the logic is coupled to the third sensor.

Aspect 12: The radio frequency front-end circuit of any of the preceding Aspects, further comprising a switchplexer, the switchplexer having an input coupled to the output of the power amplifier, to the second node, and to the second sensor.

Aspect 13: The radio frequency front-end circuit of Aspect 12, further comprising a third sensor coupled to a third node coupled to an output of the switchplexer, the third sensor being configured to sense at least one of a third power or a third voltage of the third node, wherein the logic is coupled to the third sensor.

Aspect 14: The radio frequency front-end circuit of any of the preceding Aspects, wherein the first node is an input of a first impedance matching circuit having an output coupled to the input of the power amplifier and wherein the second node is an output of a second impedance matching circuit having an input coupled to the output of the power amplifier.

Aspect 15: A method of wireless communications, comprising: operating a power amplifier with a gain; sensing at least one of a first power or a first voltage of a first node coupled to an input of the power amplifier; sensing at least one of a second power or a second voltage of a second node coupled to an output of the power amplifier; determining that the at least one of the second power or the second voltage is outside a range based on the gain and the at least one of the first power or the first voltage; and taking an action to protect the power amplifier based on the determination.

Aspect 16: The method of Aspect 15, wherein taking the action comprises lowering a bias for the power amplifier.

Aspect 17: The method of Aspect 15 or 16, wherein taking the action comprises lowering a power supply voltage for the power amplifier.

Aspect 18: The method of any of Aspects 15-17, wherein taking the action comprises engaging an attenuator having an output coupled to the input of the power amplifier.

Aspect 19: The method of any of Aspects 15-18, wherein taking the action comprises lowering a magnitude of an input signal for the power amplifier.

Aspect 20: The method of Aspect 15, wherein taking the action comprises powering off the power amplifier.

Aspect 21: The method of any of Aspects 15-19, further comprising: sensing at least one of a third power or a third voltage of the first node coupled to the input of the power amplifier; sensing at least one of a fourth power or a fourth voltage of the second node coupled to the output of the power amplifier; determining that the at least one of the fourth power or the fourth voltage is inside another range based on the gain and the at least one of the third power or the third voltage; and reversing the action taken to protect the power amplifier based on the determination of being inside the other range.

Aspect 22: An apparatus for wireless communications, comprising: means for amplifying a signal with a gain; first means for sensing at least one of a first power or a first voltage of a first node coupled to an input of the means for amplifying; second means for sensing at least one of a second power or a second voltage of a second node coupled to an output of the means for amplifying; means for determining that the at least one of the second power or the second voltage is outside a range based on the gain and the at least one of the first power or the first voltage; and means for taking an action to protect the means for amplifying based on the determination.

Additional Considerations

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components. For example, means for amplifying a signal with a gain may include a PA, such as the PA 318 of FIG. 3, 4A, or 4B. First means and second means for sensing at least one of a first power or a first voltage may include at least one sensor, such as the sensors 416A, 416B, 416C of FIG. 4A or 4B. Means for determining that the at least one of the second power or the second voltage is outside a range based on the gain of the PA and the at least one of the first power or the first voltage, and means for taking an action may include logic, such as the logic 418 of FIG. 4A or 4B.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A radio frequency front-end circuit comprising:
a power amplifier configured to amplify an input signal with a gain;
a first sensor coupled to a first node coupled to an input of the power amplifier and configured to sense at least one of a first power or a first voltage of the first node;
a second sensor coupled to a second node coupled to an output of the power amplifier and configured to sense at least one of a second power or a second voltage of the second node; and
logic coupled to the first sensor and the second sensor and configured to:
 determine that the at least one of the second power or the second voltage is outside a range based on the gain and the at least one of the first power or the first voltage; and
 take an action to protect the power amplifier based on the determination, wherein in taking the action, the logic is configured to control lowering a power supply voltage for the power amplifier.

2. The radio frequency front-end circuit of claim 1, wherein in taking the action, the logic is further configured to control lowering of a bias for the power amplifier.

3. The radio frequency front-end circuit of claim 1, further comprising an attenuator having an output selectively coupled to the input of the power amplifier, wherein in taking the action, the logic is further configured to control engagement of the attenuator.

4. The radio frequency front-end circuit of claim 1, wherein in taking the action, the logic is further configured to control lowering a magnitude of an input signal for the power amplifier.

5. The radio frequency front-end circuit of claim 1, wherein in taking the action, the logic is further configured to control powering off the power amplifier.

6. The radio frequency front-end circuit of claim 1, wherein the logic is further configured to output an indication based on the determination.

7. The radio frequency front-end circuit of claim 1, further comprising a drive amplifier having an input coupled to the first node and to the first sensor and having an output coupled to the input of the power amplifier.

8. The radio frequency front-end circuit of claim 1, further comprising an impedance matching circuit having an input coupled to the output of the power amplifier and having an output coupled to the second node and to the second sensor.

9. The radio frequency front-end circuit of claim 1, further comprising a filter or a duplexer, the filter or the duplexer having an input coupled to the output of the power amplifier, to the second node, and to the second sensor.

10. The radio frequency front-end circuit of claim 9, further comprising a third sensor coupled to a third node coupled to an output of the filter or the duplexer, the third sensor being configured to sense at least one of a third power or a third voltage of the third node, wherein the logic is coupled to the third sensor.

11. The radio frequency front-end circuit of claim 1, further comprising a switchplexer, the switchplexer having an input coupled to the output of the power amplifier, to the second node, and to the second sensor.

12. The radio frequency front-end circuit of claim 11, further comprising a third sensor coupled to a third node coupled to an output of the switchplexer, the third sensor being configured to sense at least one of a third power or a third voltage of the third node, wherein the logic is coupled to the third sensor.

13. The radio frequency front-end circuit of claim 1, wherein the first node is an input of a first impedance matching circuit having an output coupled to the input of the power amplifier and wherein the second node is an output of a second impedance matching circuit having an input coupled to the output of the power amplifier.

14. A method of wireless communications, comprising:
operating a power amplifier with a gain;
sensing at least one of a first power or a first voltage of a first node coupled to an input of the power amplifier;
sensing at least one of a second power or a second voltage of a second node coupled to an output of the power amplifier;
determining that the at least one of the second power or the second voltage is outside a range based on the gain and the at least one of the first power or the first voltage; and taking an action to protect the power amplifier based on the determination, wherein taking the action comprises lowering a power supply voltage for the power amplifier.

15. The method of claim 14, wherein taking the action further comprises lowering a bias for the power amplifier.

16. The method of claim 14, wherein taking the action further comprises engaging an attenuator having an output coupled to the input of the power amplifier.

17. The method of claim 14, wherein taking the action further comprises lowering a magnitude of an input signal for the power amplifier.

18. The method of claim 14, wherein taking the action further comprises powering off the power amplifier.

19. The method of claim 14, further comprising:
sensing at least one of a third power or a third voltage of the first node coupled to the input of the power amplifier;
sensing at least one of a fourth power or a fourth voltage of the second node coupled to the output of the power amplifier;
determining that the at least one of the fourth power or the fourth voltage is inside another range based on the gain and the at least one of the third power or the third voltage; and
reversing the action taken to protect the power amplifier based on the determination of being inside the other range.

20. An apparatus for wireless communications, comprising:
means for amplifying a signal with a gain;
first means for sensing at least one of a first power or a first voltage of a first node coupled to an input of the means for amplifying;
second means for sensing at least one of a second power or a second voltage of a second node coupled to an output of the means for amplifying;
means for determining that the at least one of the second power or the second voltage is outside a range based on the gain and the at least one of the first power or the first voltage; and
means for taking an action to protect the means for amplifying based on the determination, wherein the means for taking the action is configured to control lowering a power supply voltage for the means for amplifying.

* * * * *